United States Patent [19]

Schlesinger et al.

[11] Patent Number: 4,987,475
[45] Date of Patent: Jan. 22, 1991

[54] ALIGNMENT OF LEADS FOR CERAMIC INTEGRATED CIRCUIT PACKAGES

[75] Inventors: Randall L. Schlesinger, Oakham; Kevin M. Eastman, Lincoln; Douglas F. Palino, Marlboro, all of Mass.

[73] Assignee: Digital Equipment Corporation, Maynard, Mass.

[21] Appl. No.: 449,518

[22] Filed: Dec. 5, 1989

Related U.S. Application Data

[63] Continuation of Ser. No. 161,914, Feb. 29, 1988, abandoned.

[51] Int. Cl.⁵ .................. B01J 17/00; B05D 5/12; H01L 23/48
[52] U.S. Cl. .................. 357/70; 437/206; 437/220; 357/74; 357/68
[58] Field of Search .................. 351/70, 74, 68

[56] References Cited

U.S. PATENT DOCUMENTS

| | | | |
|---|---|---|---|
| 3,657,805 | 4/1972 | Johnson | 357/70 |
| 4,217,426 | 6/1981 | Hargis | 357/74 |
| 4,289,922 | 9/1981 | Devlin | 174/52 |
| 4,408,218 | 10/1983 | Grabbe | 357/70 |
| 4,437,141 | 3/1984 | Prokop | 361/403 |
| 4,626,478 | 12/1986 | vanDyk Soerewyn | 428/596 |
| 4,661,837 | 4/1987 | Sono | 357/70 |
| 4,672,418 | 6/1987 | Moran et al. | 357/70 |
| 4,733,292 | 3/1988 | Jarvis | 357/70 |
| 4,753,820 | 6/1988 | Cusack | 357/55 |
| 4,754,317 | 6/1988 | Comstock et al. | 357/70 |
| 4,768,077 | 8/1988 | Scherer | 357/80 |
| 4,771,330 | 9/1988 | Long | 357/70 |
| 4,774,635 | 9/1988 | Greenberg et al. | 357/70 |
| 4,803,540 | 2/1989 | Moyer et al. | 357/70 |
| 4,809,053 | 2/1989 | Kuraishi | 357/70 |
| 4,809,135 | 2/1989 | Yerman | 357/70 |
| 4,818,821 | 4/1989 | Wentworth et al. | 357/70 |

FOREIGN PATENT DOCUMENTS

| | | | |
|---|---|---|---|
| 63-221653 | 9/1988 | Japan | 357/74 |
| 2079534 | 1/1982 | United Kingdom . | |

Primary Examiner—Andrew J. James
Assistant Examiner—Viet Q. Nguyen
Attorney, Agent, or Firm—Hayes, Soloway, Hennessey & Hage

[57] ABSTRACT

An alignment system comprising a rectangular leadframe from the interior of which extend leads to terminations arrangement for alignment and registration with the braze pads of a ceramic integrated circuit package, the alignment and registration being maintained and defined by a web bar interconnecting the leads adjacent the between those braze pads and the leadframe. The leadframe, leads and web bar being integrally formed by etching and lying in a plane.

3 Claims, 2 Drawing Sheets

ALIGNMENT OF LEADS FOR CERAMIC INTEGRATED CIRCUIT PACKAGES

This a continuation of copending application Ser. No. 07/161,914 filed on Feb. 29, 1988, abandoned.

The present invention relates to the alignment of leads during brazing of these leads to connecting pads of ceramic integrated circuit (hereinafter IC) packages.

BACKGROUND OF THE INVENTION

Until the present invention, leads to be brazed onto braze pads of leadless IC packages have been positioned by means of a leadframe, from which the leads project inwardly in the plane of the frame, over the braze pads for brazing thereto. With this cantilever arrangement of leads, a positioning tolerance of +/−0.005 inches at the ends of the leads to be attached to the braze pads is difficult to improve upon. With fine pitch lead connections on ceramic packages, a positioning tolerance at the connection is desirably +/−0.002 inches. One proposal to achieve this positioning tolerance is to use a removable plastic support. However, such a method is relatively expensive, not totally effective and rather complex to achieve in view of the braze pad spacing on such fine lead pitch packages of only 0.025 inches center to center. In another prior art proposal, a snap-off tie bar which ties all of the leads together at their very tip is proposed. At the braze pads, the tie bar extends up off the ceramic package so that it may be snapped off after brazing. Each lead is necked down at its connection with the tie bar to allow the tie bar to be easily snapped off. A disadvantage of this arrangement is that the tie bar leaves only two sides of the lead exposed for brazing onto the braze pad with the end of the lead being prevented from forming part of the brazed joint because of its connection with the tie bar. In addition this arrangement leaves "pigtails" of metal after tie bar removal leading to handling and space utilization problems. Further, the tie bar concept requires special handling for removal of the tie bar and an additional step in the production of the leadframe because of the requirement that the tie bar be shaped to extend off of the ceramic package to facilitate its removal. The special handling for removal of the tie bar also involves additional steps.

It is known in the production of plastic IC packages, in which a leadframe is used to connect leads, which extend through the molded plastic package to the chip housed therein, to use a dam bar interconnecting the leads in the plane of the leadframe to act as a dam to limit the flow of plastic during injection molding of the package. This is necessary as the two mold halves are clamped together with the leads projecting through an opening between them thereby leaving gaps between the leads and the mold halves through which the plastic can extrude during molding. The dam bar prevents any significant flow of plastic resulting from this. The dam bar is then removed by punching operation and the small amount of extruded plastic projecting from the package is also removed.

It is an object of the present invention to provide enhanced lead alignment capable of providing the desired positioning tolerance between the ends of leads while they are brazed to braze pads of fine pitch ceramic IC packages and of improving dissipation of heat generated by this brazing.

SUMMARY OF THE INVENTION

According to one aspect of the invention there is provided an alignment system for defining alignment and registration of leads during attachment of those leads to a ceramic IC package comprising a leadframe, a plurality of leads extending inwardly from and supported by said leadframe to lead terminations positioned for registration of said terminations with lead attachment points on a said package for attachment thereto and a web bar interconnecting said leads adjacent their terminations between said terminations and said leadframe.

According to a second aspect of the invention there is provided a ceramic IC package in combination with an alignment system for defining alignment and registration of leads during attachment of those leads to the ceramic IC package comprising a leadframe, a plurality of leads extending inwardly from and supported by said leadframe to lead terminations positioned for registration of said terminations with lead attachment points on a said package for attachment thereto and a web bar interconnecting said leads adjacent their terminations between said terminations and said leadframe, said lead terminations being attached to said attachment points.

According to a third aspect of the invention there is provided a method of providing desired alignment and registration of lead terminations of leads, supported by a leadframe, with attachment points on a ceramic IC package, comprising the steps of interconnecting the leads adjacent their terminations between said terminations and said leadframe, bringing said terminations into alignment and registration with said attachment points, attaching said lead terminations to said attachment points while so aligned and registered and subsequently removing said interconnections.

According to a fourth aspect of the invention there is provided a product made by the method of the preceding paragraph.

The present invention enhances the positioning tolerance of the ends of leads for brazing to braze pads of fine pitch ceramic IC packages. It permits improved alignment of these leads with respect to the package and with respect to adjacent leads. This improved alignment of the leads at the braze points translates to improved true-positioning or lead registration at the printed circuit board interface upon surface mounting of the finished device. Additionally the web bar arrangement increases dissipation of heat generated by the brazing process and reduces warpage during cooling. The invention preferably provides these enhancements using a planar leadframe construction in which the frame, leads and the web bar are integral. This provides an economical produced simple extremely effective arrangement.

BRIEF DESCRIPTION OF THE DRAWINGS

The invention will now be described, by way of example, with reference to the accompanying drawings, in which.

DESCRIPTION OF THE PREFERRED EMBODIMENT

Figure 1:
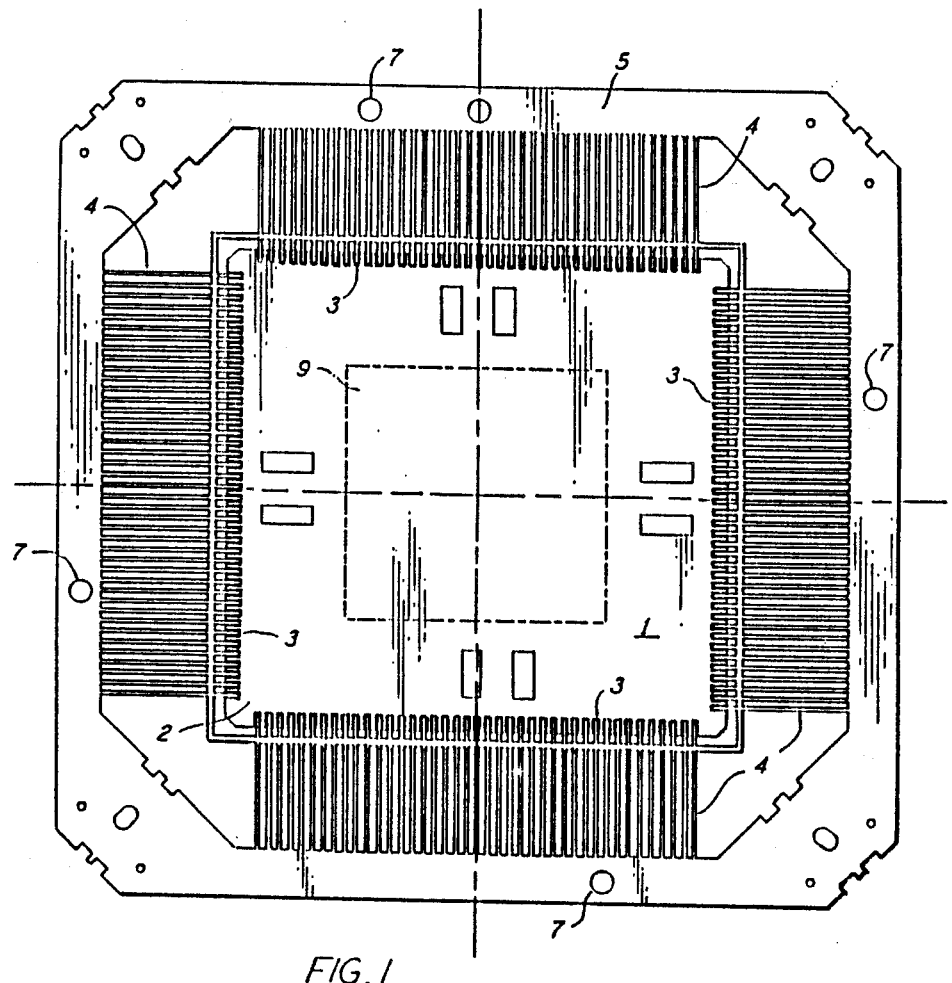
FIG. 1 is a plan view of a leadframe with the web bar of the present invention shown after brazing to a fine lead pitch ceramic IC package.
Figure 3:
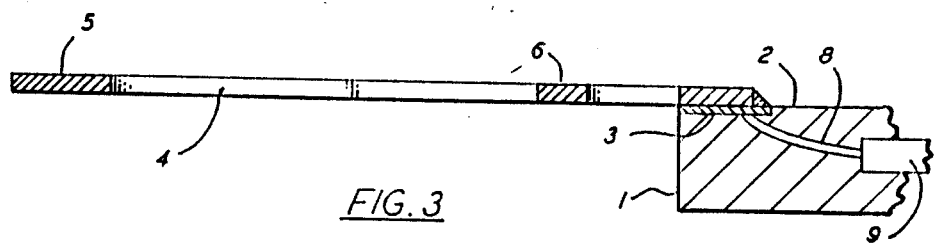
FIG. 3 is a section along section line 3—3 shown in FIG. 2.
Figure 2:
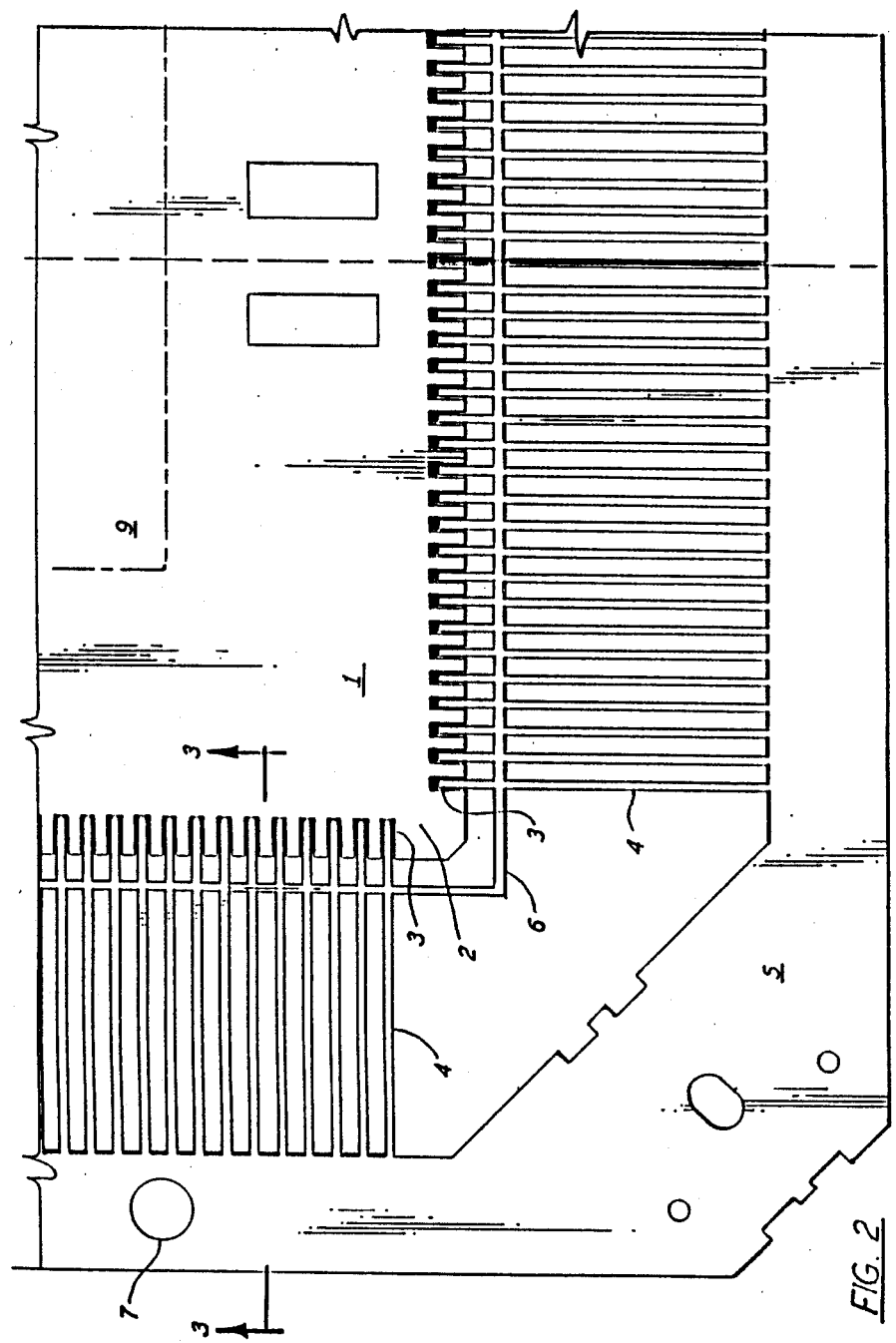
FIG. 2 is an enlarged portion of one corner of the leadframe illustrated in FIG. 1.

With reference first to the drawings, a fine lead pitch ceramic IC package 1, square in plan, carries on its face 2, a row of braze pads adjacent each of its four edges. The braze pads are evenly spaced apart with their centers spaced by 0.025 inches plus/minus 0.002 inches. Within the package 1 the braze pads are connected as appropriate to the IC 9 housed therein, by connections 8 (see FIG. 3). A plurality of leads 4 terminate at and are brazed to the braze pads with each lead brazed on both of its sides and on its end at its termination. The leads 4 associated with each of the four sides of the package 1 are parallel to one another, lie in a plane and extend normal to their associated side of the package. The leads are preferably a gold or nickel plated iron-nickel-cobalt alloy such as that sold under the trademark KOVAR by Westinghouse Electric Corporation. The leads are supported at their outer ends, the ends remote from those to the braze pads, by a leadframe 5 lying in the plane of the lead 5. This frame 5 connects all of the leads from all four sides of the package 1 together to provide alignment of the leads and support during assembly including brazing to the braze pads. Adjacent the four sides of the package 1 a web bar 6 lying in the plane of the leads 4 and the leadframe 5 interconnects all of the leads. The web bar comprises four portions, one for each side of the package with the four web bar portions being jointed at the corners of the package 1. The leadframe 5, leads 4 and web bar 6 are integral and are typically produced by etching as an entirely separate step from the ceramic package producing process. The manner of producing this integral structure will be well known to those skilled in the art.

The leadframe is spaced from the braze pads by approximately 0.285 inches while the wed bar is spaced from the brazed points by approximately 0.060 inches thereby to provide an improvement in alignment and registration of the inner terminal ends of the leads 4 with respect to the braze pads.

Preparatory to the brazing operation, the integral structure comprising the leads 4, leadframe 5 and web bar 6 are brought into alignment and registration with the braze pads and held in that alignment while the inner terminal ends of the leads 4 a brazed onto the braze pads of the ceramic package 1 at a furnace temperature of between 800 and 1,000 degrees C.

After brazing the web bars are mechanically removed using a punch trim tool. The trim tool is aligned with the leads for accurate removal of the web bar by means of tooling holes 7 in the leadframe 5. Subsequently, the leads are trimed from the leadframe and deformed, from the plane they lie in during assembly, into a gull-wing form to facilitate surface mounting of the package 1 onto a printed circuit board.

The surface mounting of the ceramic IC package is facilitated by the accurate alignment and registration of the formed leads relative to the lands on the printed circuit boards for soldering thereto. Accurate placement of the leads to the land's provides increased surface mount yields and, consequently increased yields of the printed circuit board assemblies. Tight tolerancing of the leads in relation to one another (true-positioning) as is provided by the present invention after forming of the leads is imperative to meet the alignment and registration requirements of printed circuit boards.

Prior to the present invention with its utilization of the web bar 6, the relationship with one lead to the next lead was specified as 0.25 inches +/−0.005 inches. With the web bar 6 disposed approximately 0.060 inches away from the braze pads, a highly desirable and tighter tolerance of 0.025 inches +/−0.002 inches is possible. The improved lead positioning at the brazed point translates to tighter tolerances at the end of the lead when the outer web bar is removed and the leads are formed for attachment to the printed circuit board.

We claim:

1. An intermediate product for use in the manufacture of a ceramic IC component with individual fine pitch metallic leads brazed to braze pads on a leadless ceramic IC package, which leads extend a substantial distance outwardly of said package, said product comprising a leadless ceramic IC package having a plurality of leadless braze pads on one planar surface thereof, said braze pads being spaced 0.025 plus/minus 0.002 inch center to center, a planar self-supporting metallic lead frame, a plurality of fine metallic leads extending inwardly of said lead frame to lead terminations aligned with and brazed to said braze pads, a web bar interconnecting said fine leads adjacent to, and within about .06 inches of, their terminations and spaced outwardly of said IC package, and means for aligning said lead frame with respect to a punch tool to be used for severing said web from said leads and said leads from said lead frame.

2. An intermediate product according to claim 1 wherein said leadframe is rectangular and a plurality of leads extend in parallel with one another from each of four sides of said leadframe for respective alignment and registration with braze pads on each of four sides of said package.

3. An intermediate product according to claim 2 wherein the web bar associated with each said plurality of leads is joined to form a rectangular web bar frame to surround a said package during attachment of said leads to said attachment points.

* * * * *